United States Patent
Xia

(10) Patent No.: US 10,996,781 B2
(45) Date of Patent: May 4, 2021

(54) DISPLAY PANEL AND DISPLAY DEVICE

(71) Applicant: Wuhan China Star Optoelectronics Semiconductor Display Technology Co., Ltd., Hubei (CN)

(72) Inventor: Cunjun Xia, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/622,815

(22) PCT Filed: Oct. 30, 2019

(86) PCT No.: PCT/CN2019/114273
§ 371 (c)(1),
(2) Date: Dec. 13, 2019

(65) Prior Publication Data
US 2021/0048904 A1    Feb. 18, 2021

(30) Foreign Application Priority Data

Aug. 13, 2019  (CN) .......................... 201910742152.1

(51) Int. Cl.
*G06F 3/045*    (2006.01)
*G06F 3/041*    (2006.01)
*G06F 3/044*    (2006.01)
*H01L 51/52*    (2006.01)
*H01L 27/32*    (2006.01)

(52) U.S. Cl.
CPC .......... *G06F 3/0412* (2013.01); *G06F 3/0445* (2019.05); *H01L 27/323* (2013.01); *H01L 27/3244* (2013.01); *H01L 51/5253* (2013.01)

(58) Field of Classification Search
CPC ........ G06F 3/041; G06F 3/0412; G06F 3/044; G06F 3/045; H01L 27/323; H01L 27/3244; H01L 51/5253
See application file for complete search history.

(56) References Cited

U.S. PATENT DOCUMENTS

| | | | | |
|---|---|---|---|---|
| 9,910,530 | B2* | 3/2018 | Aoyama | G06F 3/0412 |
| 2008/0062139 | A1* | 3/2008 | Hotelling | G06F 3/0444 |
| | | | | 345/173 |
| 2009/0273572 | A1* | 11/2009 | Edwards | G06F 3/047 |
| | | | | 345/173 |
| 2011/0187672 | A1* | 8/2011 | Hung | G06F 3/0443 |
| | | | | 345/174 |
| 2012/0092577 | A1* | 4/2012 | Shi | G02F 1/13338 |
| | | | | 349/43 |

(Continued)

*Primary Examiner* — Joe H Cheng
(74) *Attorney, Agent, or Firm* — Hamre, Schumann, Mueller & Larson, P.C.

(57) ABSTRACT

A display panel and a display device are provided. The display panel and the display device include a touch layer including a first electrode layer, a pixel definition layer, and a second electrode layer. The first electrode layer includes at least one first electrode group disposed along a first direction, the second electrode layer includes at least one second electrode group disposed along a second direction, the pixel definition layer covers the at least one first electrode group, and the at least one first electrode group is disposed perpendicular to the at least one second electrode group.

18 Claims, 7 Drawing Sheets

(56) References Cited

U.S. PATENT DOCUMENTS

| | | | |
|---|---|---|---|
| 2012/0154326 A1* | 6/2012 | Liu | G06F 3/046 345/174 |
| 2013/0328812 A1* | 12/2013 | Kim | G06F 1/13338 345/173 |
| 2014/0078104 A1* | 3/2014 | Lee | G06F 3/0416 345/174 |
| 2014/0333555 A1* | 11/2014 | Oh | G06F 3/044 345/173 |
| 2015/0041203 A1* | 2/2015 | Lebens | H05K 1/0296 174/261 |
| 2016/0018935 A1* | 1/2016 | Wei | H01L 27/1248 345/173 |
| 2016/0139708 A1* | 5/2016 | Tseng | G06F 3/0418 345/174 |
| 2016/0170524 A1* | 6/2016 | Kim | G06F 3/0445 345/174 |
| 2016/0329387 A1* | 11/2016 | Mohanan | H01L 51/5221 |
| 2017/0300156 A1* | 10/2017 | Oh | G02F 1/13338 |
| 2018/0067597 A1* | 3/2018 | Kim | G06F 3/0416 |
| 2019/0220123 A1* | 7/2019 | Kanaya | G06F 3/0443 |
| 2020/0174609 A1* | 6/2020 | Yoo | G06F 3/0412 |
| 2020/0266246 A1* | 8/2020 | Bok | H01L 51/5212 |
| 2020/0293150 A1* | 9/2020 | Jeong | G06F 3/0446 |

\* cited by examiner

DISPLAY PANEL AND DISPLAY DEVICE

CROSS REFERENCE TO RELATED APPLICATIONS

This application is a National Stage of PCT/CN2019/114273, filed on Oct. 30, 2019 and claims the benefit of priority of Chinese Patent Application No. CN201910742152.1, filed on Aug. 13, 2019. The entire contents of each of the above-identified applications are incorporated herein by reference.

BACKGROUND OF INVENTION

Field of Invention

The present invention belongs the field of display, and more particularly, to a display panel and a display device.

Description of Prior Art

As an important indicator of intelligence, touch technology has become more and more widely applied. Being rapidly developed, the touch technology may be divided into piezoresistive, optical, and capacitive touch technologies, according to the touch principle. Among these, after many generations of development, the capacitive touch technology has been the most widely applied. The capacitive touch technology may be generally divided into "add-on touch", "on-cell touch," and "in-cell touch."

In the prior art, the in-cell touch technology reduces the thickness of organic light emitting diode (OLED) display devices, but the process is complicated, increasing difficulty and cost in the process. Furthermore, forming touch layers on thin film encapsulation layers increases a risk of the encapsulation being invalid.

Therefore, there is a need for a display panel to solve the above technical problems.

SUMMARY OF INVENTION

The present invention provides a display panel and a display device, in order to solve the technical problem that the process of manufacturing in-cell touch is complicated.

For solving the above problems, the present invention provides the technical solutions as follows.

The present invention provides a display panel. The display panel includes a substrate, a touch layer on the substrate, a first electrode layer, a pixel definition layer on the first electrode layer, and a second electrode layer on the pixel definition layer, in which the touch layer includes the first electrode layer, the first electrode layer includes at least one first electrode group disposed along a first direction, the second electrode layer includes at least one second electrode group disposed along a second direction, the pixel definition layer covers the first electrode group, and the first electrode group is disposed perpendicular to the second electrode group.

In one embodiment of the display panel of the present invention, the display panel further includes a thin film transistor layer on the substrate, and a light emitting device layer on the thin film transistor layer, in which the light emitting device layer and the touch layer are disposed in a same layer, and the light emitting device layer includes an anode layer, a light emitting layer on the anode layer, and a cathode layer on the light emitting layer; and the anode layer includes at least one anode disposed along the first direction, the cathode layer includes at least one cathode disposed along the second direction, the anode is spaced apart from and insulated from the first electrode group, and the cathode is spaced apart from and insulated from the second electrode group.

In one embodiment of the display panel of the present invention, at least one first electrode group is disposed between two adjacent anodes in the first direction, and at least one second electrode group is disposed between two adjacent cathodes in the second direction.

In one embodiment of the display panel of the present invention, the first electrode layer and the anode layer are disposed in a same layer.

In one embodiment of the display panel of the present invention, the first electrode layer and the anode layer are disposed in different layers, the anode layer is on the thin film transistor layer and contacts the thin film transistor layer, and the first electrode layer is in the pixel definition layer.

In one embodiment of the display panel of the present invention, the second electrode layer and the cathode layer are formed by a same masking process.

In one embodiment of the display panel of the present invention, the display panel further includes an insulation layer on the second electrode layer, the cathode layer includes a first cathode layer and a second cathode layer, the first cathode layer is on the insulation layer, the second cathode layer is on the light emitting layer, and a cross-section of the insulation layer is in a shape of an inverted trapezoid.

In one embodiment of the display panel of the present invention, the display panel further includes a thin film encapsulation layer on the light emitting device layer, and the second electrode layer is in the thin film encapsulation layer.

In one embodiment of the display panel of the present invention, the display panel further includes a light shielding layer between the substrate and the thin film transistor layer, and the first electrode layer and the light shielding layer are disposed in a same layer.

In one embodiment of the display panel of the present invention, the display panel further includes a second touch wiring layer, the second touch wiring layer includes at least one second touch wire, the second touch wire is at an edge of the display panel, the second touch wire is electrically connected to the second electrode group, and the second touch wiring layer and the light shielding layer are disposed in a same layer.

The present invention further provides a display device, including a display panel. The display panel includes a substrate, a touch layer on the substrate, a first electrode layer, a pixel definition layer on the first electrode layer, and a second electrode layer on the pixel definition layer, in which the touch layer includes the first electrode layer, the first electrode layer includes at least on first electrode group disposed along a first direction, the second electrode layer includes at least on second electrode group disposed along a second direction, the pixel definition layer covers the first electrode group, and the first electrode group is disposed perpendicular to the second electrode group.

In one embodiment of the display device of the present invention, the display panel further includes a thin film transistor layer on the substrate, and a light emitting device layer on the thin film transistor layer. The light emitting device layer and the touch layer are disposed in a same layer, and the light emitting device layer includes an anode layer, a light emitting layer on the anode layer, and a cathode layer on the light emitting layer, in which the anode layer includes at least one anode disposed along the first direction, the cathode layer includes at least one cathode disposed along the second direction, the anode is spaced apart from and insulated from the first electrode group, and the cathode is spaced apart from and insulated from the second electrode group.

In one embodiment of the display device of the present invention, at least one first electrode group is disposed between two adjacent anodes in the first direction, and at least one second electrode group is disposed between two adjacent cathodes in the second direction.

In one embodiment of the display device of the present invention, the first electrode layer and the anode layer are disposed in a same layer.

In one embodiment of the display device of the present invention, the first electrode layer and the anode layer are disposed in different layers, the anode layer is on the thin film transistor layer and contacts the thin film transistor layer, and the first electrode layer is in the pixel definition layer.

In one embodiment of the display device of the present invention, the second electrode layer and the cathode layer are formed by a same masking process.

In one embodiment of the display device of the present invention, the display panel further includes an insulation layer on the second electrode layer, the cathode layer includes a first cathode layer and a second cathode layer, the first cathode layer is on the insulation layer, the second cathode layer is on the light emitting layer, and a cross-section of the insulation layer is in a shape of an inverted trapezoid.

In one embodiment of the display device of the present invention, the display panel further includes a thin film encapsulation layer on the light emitting device layer, and the second electrode layer is in the thin film encapsulation layer.

In one embodiment of the display device of the present invention, the display panel further includes a light shielding layer between the substrate and the thin film transistor layer, and the first electrode layer is disposed in a same layer as the light shielding layer.

In one embodiment of the display device of the present invention, the display panel further includes a second touch wiring layer, in which the second touch wiring layer includes at least one second touch wire, the second touch wire is at an edge of the display panel, the second touch wire is electrically connected to the second electrode group, and the second touch wiring layer and the light shielding layer are disposed in a same layer.

The benefits of the present invention are described below:

In the touch layer of the present invention, the sensing electrode layer and the anode layer are disposed in the same layer, and the drive electrode layer and the cathode layer are disposed in the same layer, such that the touch layer is incorporated with the light emitting device layer. Therefore, the thickness of the display panel is decreased, and the manufacturing process of touch layer is simplified.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained by those skilled in the art based on the drawings without any creative effort.

DETAILED DESCRIPTION OF PREFERRED EMBODIMENTS

Figure 1:
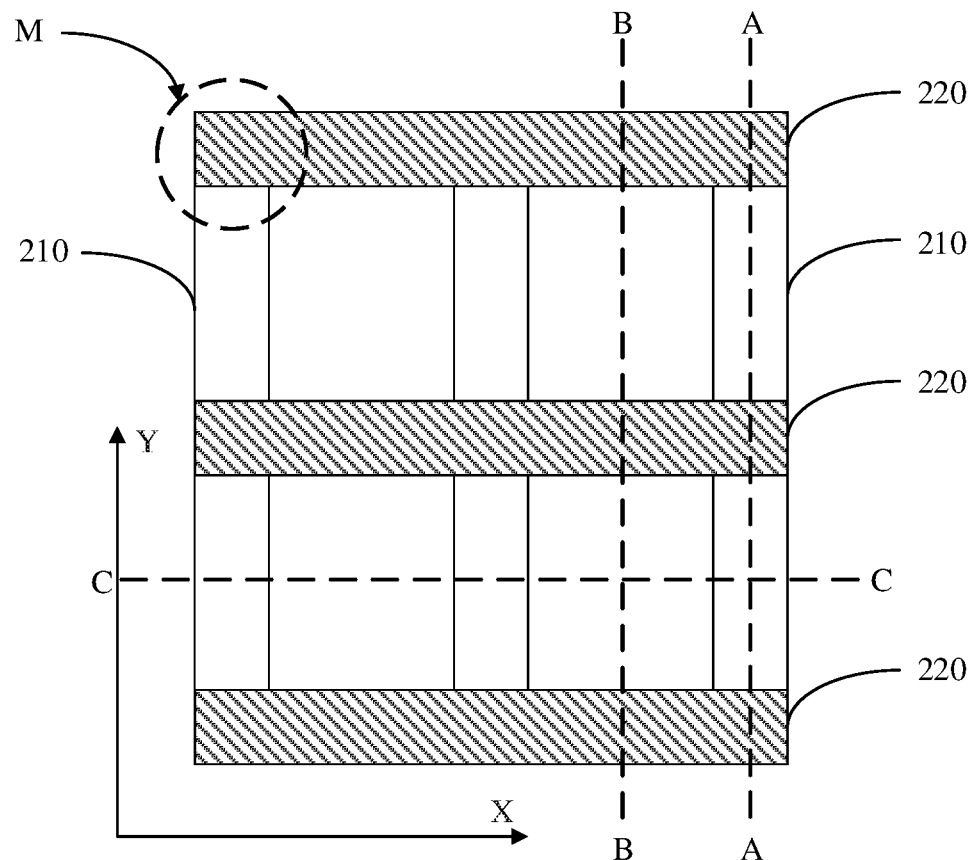
FIG. 1 is a first top view of a structure of a display panel of the present invention.

The following description of the embodiments is provided by reference to the following drawings, in order to illustrate the specific embodiments that can be carried out by the present invention. Directional terms mentioned in the present invention, such as "up," "down," "forward," "backward," "left," "right," "inside," "outside," "side," etc., are merely used to indicate the direction of the drawings. Therefore, the directional terms are used for illustrating and understanding the present invention, rather than limiting thereof. In the figures, elements with similar structure are indicated by the same reference numerals.

In view of the current technology, in comparison with on-cell touch technology, in-cell touch technology may reduce the thickness of OLED display devices; however, the process of manufacturing in-cell touch is complicated, resulting in high difficulty and cost in the process. Besides, forming touch layers on thin film encapsulation layers will increase a risk of the encapsulation being invalid. Therefore, the present invention provides a display panel to solve the above technical problems.

Referring to FIGS. 1 to 12, a display panel 100 includes a substrate 10, a touch layer 20 on the substrate 10, a first electrode layer 21, which is included in the touch layer 20, a pixel definition layer 30 on the first electrode layer 21, and a second electrode layer 22 on the pixel definition layer 30.

Referring to FIG. 1, the first electrode layer 21 includes at least one first electrode group 210 disposed along a first direction X. The second electrode layer 22 includes at least one second electrode group 220 disposed along a second direction Y. The first electrode group 210 and the second electrode group 220 are arranged in a crisscross pattern in the first direction X and the second direction Y.

Figure 2:
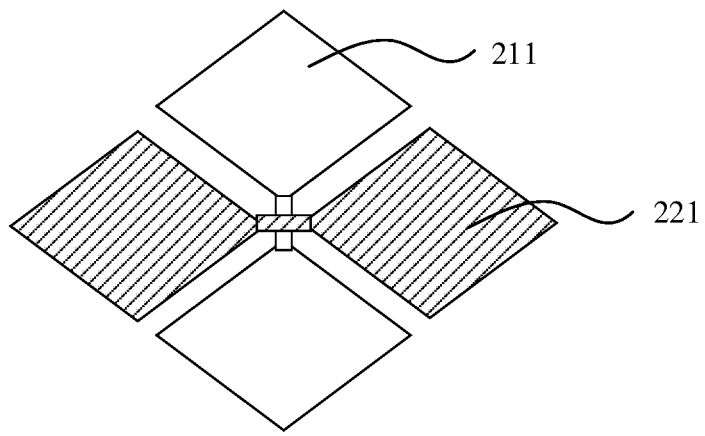
FIG. 2 is an enlarged view of a region M shown in FIG. 1.

Referring to FIG. 2, any one of the first electrode groups 210 includes at least one first electrode 211 disposed along the second direction Y, and two adjacent first electrodes 211 are electrically connected to each other. Any one of the second electrode groups 220 includes at least one second electrode 221 disposed along the first direction X, and two adjacent second electrodes 221 are electrically connected to each other.

In this embodiment, the first direction X may be a direction which is parallel with a long side of the display panel 100, and the second direction Y may be a direction which is parallel with a short side of the display panel 100.

In this embodiment, the pixel definition layer 30 covers the first electrode group 210, and the first electrode group 210 is disposed perpendicular to the second electrode group 220.

In the present invention, the first electrode layer 21 and the second electrode layer 22 in the touch layer 20 are disposed at an upper side and a lower side of the pixel definition layer 30, respectively, such that the touch layer 20 is incorporated in a light emitting device layer 50. In addition, during the manufacturing of an anode layer 51 and a cathode layer 53 in the light emitting device layer 50, the manufacturing of the first electrode layer 21 and the second electrode layer 22 may be simultaneously performed, such that the manufacturing process of in-cell touch is simplified, and the thickness of the display panel 100 is decreased.

The technical solutions of the present invention are described by the following specific embodiments.

Referring to FIGS. 1 to 12, the display panel 100 may further include a thin film transistor layer 40 on the substrate 10. The thin film transistor layer 40 may include at least one thin film transistor. A structure of the thin film transistor may be one of an etch barrier type, a back channel etch type, or a top gate thin film transistor type, and is not particularly limited.

For example, the thin film transistor being the top gate thin film transistor type may include: a buffer layer, an active layer, a gate insulating layer, a gate layer, an interlayer dielectric layer, a source drain layer, and a planar layer. The above structure in the thin film transistor will not be described in detail herein.

In this embodiment, the substrate 10 may be one of a glass substrate, a quartz substrate, or a resin substrate. The substrate 10 may also be a flexible substrate. The flexible substrate may be made of a material such as polyimide (PI). The flexibility of the substrate 10 may be further increased by disposing two polyimide layers.

Referring to FIGS. 1 to 12, the display panel 100 may further include the light emitting device layer 50 on the substrate 10. The light emitting device layer 50 includes the anode layer 51, a light emitting layer 52 on the anode layer 51, and the cathode layer 53 on the light emitting layer 52.

In view of the present display panel 100, it can be classified as a top emission display panel 100 or a bottom emission display panel 100, based on the difference in light emission direction. The following specific embodiments of the present invention are described by taking the top light emission display panel 100 as an example.

The anode layer 51 of the present invention may be made of a non-transparent material, and the cathode layer 53 may be made of a transparent material. A light source emitted by the light emitting layer 52 is reflected by the anode layer 51 and then emanates from a mask layer.

Referring to FIGS. 1 to 11, the anode layer 51 may include at least one anode 510 disposed along the first direction X or/and the second direction Y. The cathode layer 53 may include at least one cathode 530 disposed along the second direction Y.

Figure 3:
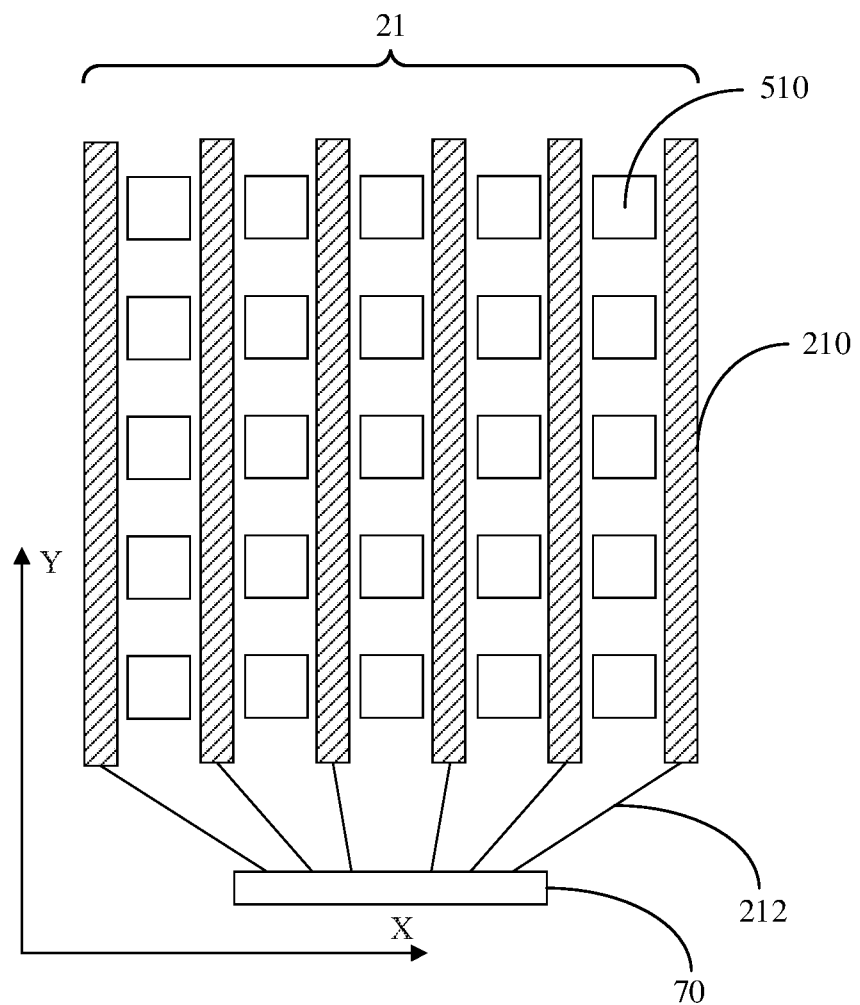
FIG. 3 is a top view of a structure of an anode layer in the display panel of the present invention.

Referring to FIG. 3, the anode 510 is arranged in an array on the display panel 100, and the anode 510 is corresponding to a subpixel.

Figure 4:
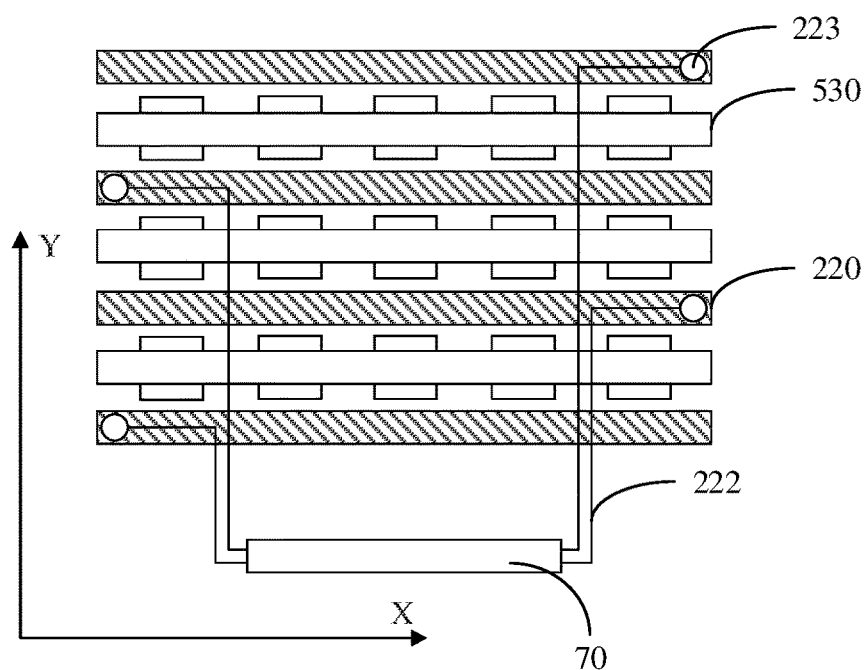
FIG. 4 is a top view of a structure of a cathode layer in the display panel of the present invention.

Referring to FIG. 4, the cathode layer 53 may include a plurality of cathodes 530 which are parallel with the first direction X, and two adjacent cathodes 530 are disposed in parallel. In a direction of the top view of the display panel 100, an orthographic projection of the cathode 530 on the substrate 10 may coincide with an orthographic projection of the anode 510 on the substrate 10.

Figure 5:
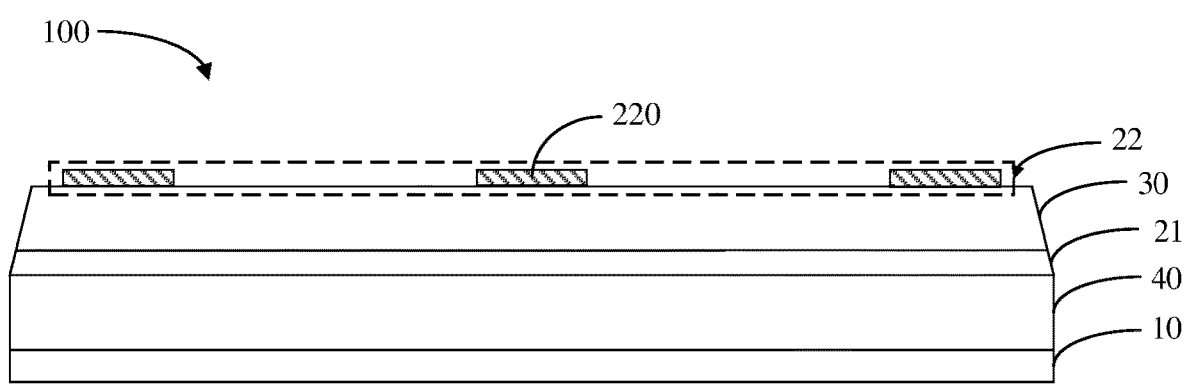
FIG. 5 is a cross-sectional view of the display panel shown in FIG. 1 taken along a A-A plane.
Figure 6:
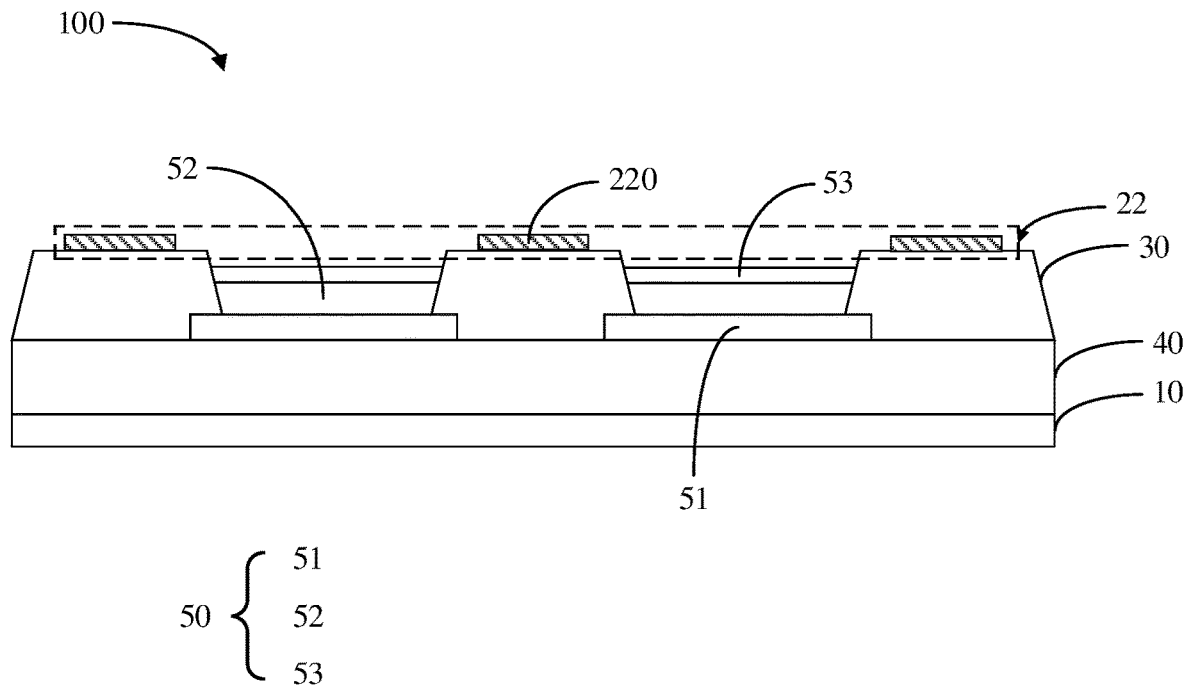
FIG. 6 is a first cross-sectional view of the display panel shown in FIG. 1 taken along a B-B plane.
Figure 7:
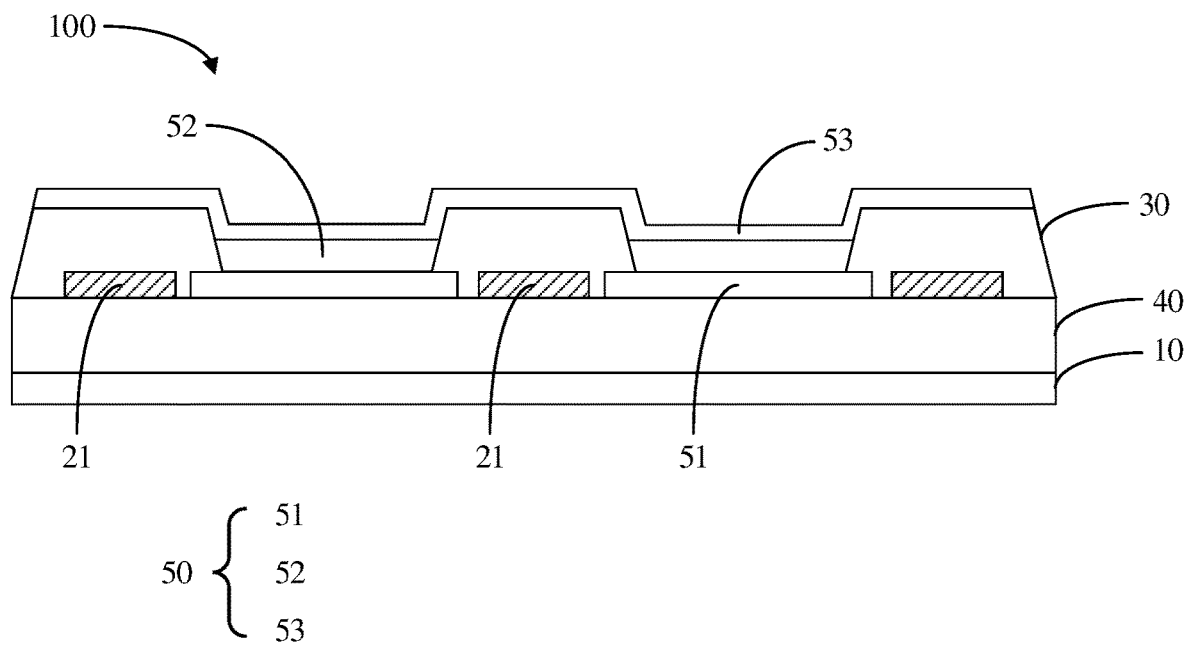
FIG. 7 is a first cross-sectional view of the display panel shown in FIG. 1 taken along a C-C plane.

Referring to FIGS. 5 to 7, the touch layer 20 and the light emitting device layer 50 may be disposed in a same layer. The first electrode layer 21 includes a plurality of first electrode groups 210 which are parallel with the second direction Y, and two adjacent first electrode groups 210 are disposed in parallel. The second electrode layer 22 includes a plurality of second electrode groups 220 which are parallel with the first direction X, and two adjacent second electrode groups 220 are disposed in parallel.

Referring to FIGS. 5 to 7, the anode layer 51 and the first electrode layer 21 may be formed by a same masking process. The anode 510 may be spaced apart from and insulated from the first electrode group 210. In this embodiment, at least one first electrode group 210 may be disposed between two adjacent anodes 510 in the first direction X.

Figure 8:
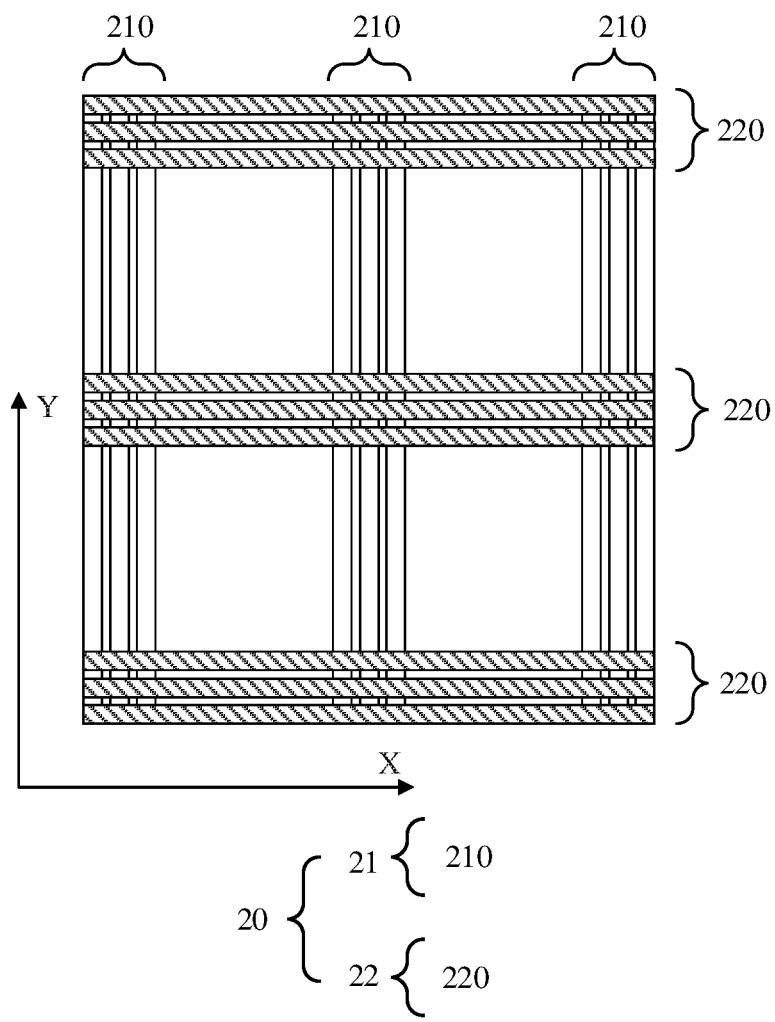
FIG. 8 is a first top view of a structure of the display panel of the present invention.

Referring to FIG. 3, one first electrode group 210 may be disposed between two adjacent anodes 510 in the first direction X. Referring to FIG. 8, three first electrode groups 210 may be disposed between two adjacent anodes 510 in the first direction X.

The number of the first electrode group 210 disposed between two adjacent anodes 510 in the first direction X may be determined based on the specific spacing and the length of the first electrode group 210 in the first direction X, and is not particularly limited herein.

Referring to FIG. 3, the first electrode layer 21 further includes a plurality of first touch wires 212. The first touch wire 212, the first electrode layer 21, and the anode layer 51 may be formed by a same masking process. One end of the first touch wire 212 is electrically connected to the first electrode group 210, and the other end of the first touch wire 212 is electrically connected to a driver chip 70.

In one embodiment, the display panel 100 further includes a thin film transistor layer 40 on the substrate 10, and a light shielding layer 41 between the substrate 10 and the thin film transistor layer 40, in which the first electrode layer 21 and the light shielding layer 41 are disposed in a same layer.

Figure 9:
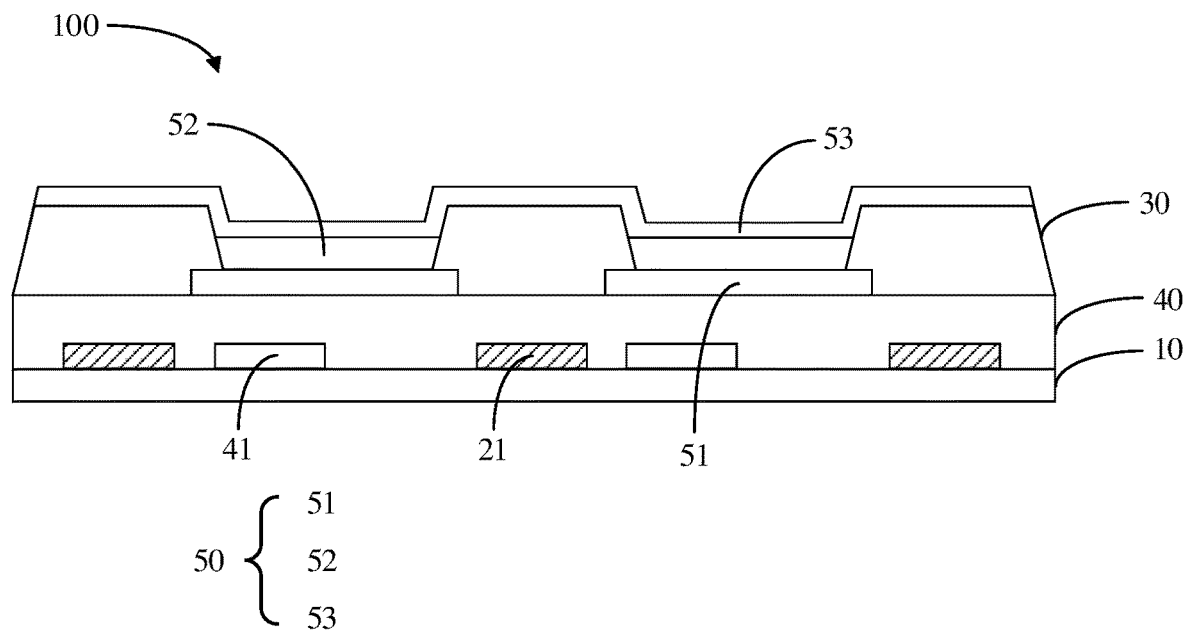
FIG. 9 is a second cross-sectional view of the display panel shown in FIG. 1 taken along the C-C plane.

Referring to FIG. 9, the first electrode layer 21 and the light shielding layer 41 are disposed in the same layer. The first electrode layer 21 and the light shielding layer 41 are formed by a same masking process.

In this embodiment, an orthographic projection of the first electrode layer 21 on the substrate 10 coincides with the orthographic projection of the first electrode layer 21 on the substrate 10 shown in FIG. 7.

Figure 10:
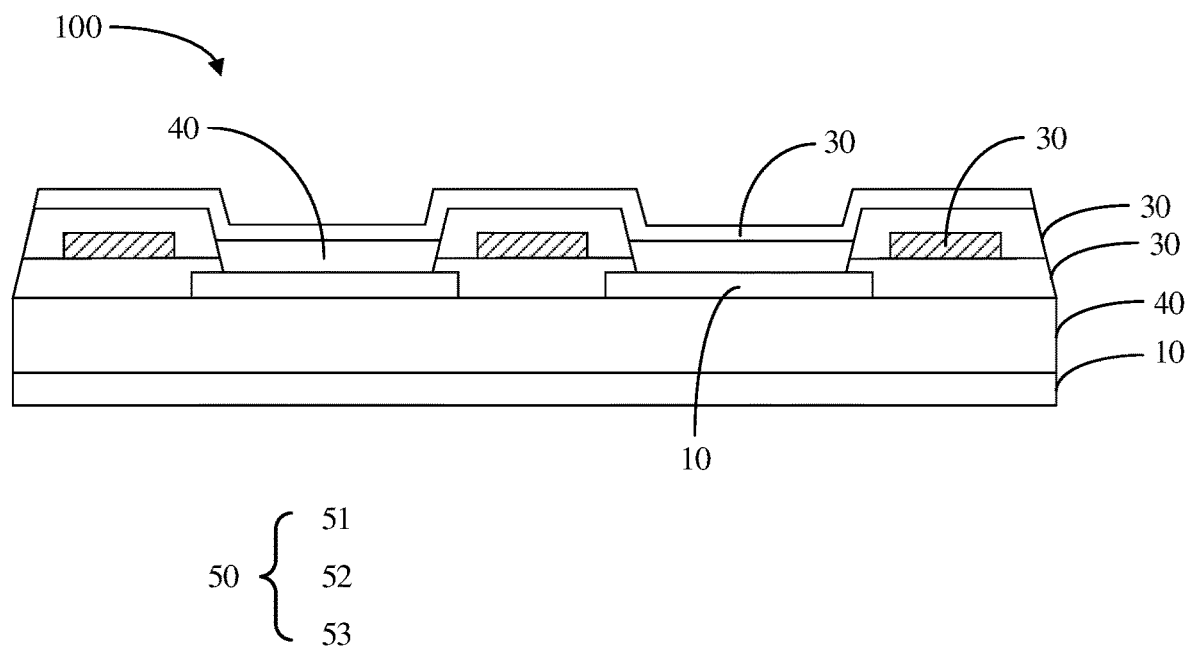
FIG. 10 is a third cross-sectional view of the display panel shown in FIG. 1 taken along the C-C plane.

In one embodiment, the first electrode layer 21 and the anode layer 51 may be disposed in different layers. Referring to FIG. 10, the anode layer 51 is on the thin film transistor layer 40 and contacts the thin film transistor layer 40, and the first electrode layer 21 may be in the pixel definition layer 30. Alternatively, by disposing two pixel definition layers 30, the first electrode layer 21 is between the two pixel definition layers 30.

In comparison with FIG. 7, the anode layer 51 and the first electrode layer 21 are disposed in different layers in this embodiment, such that electrical connection of the anode layer 51 and the first electrode layer 21 occurring in the process is prevented.

Referring to FIGS. 5 to 7, the second electrode layer 22 may be on the pixel definition layer 30, and the cathode layer 53 may be on the light emitting layer 52. The second electrode layer 22 and the cathode layer 53 may be formed by a same masking process. By a patterning process, the second electrode layer 22 including a plurality of second electrode groups 220 and the cathode layer 53 including a plurality of cathodes 530 are formed. The cathode 530 may be spaced apart from and insulated from the second electrode group 220.

In this embodiment, at least one second electrode group 220 may be disposed between two adjacent cathodes 530 in the second direction Y. Referring to FIG. 4, one second electrode group 220 may be disposed between two adjacent cathodes 530 in the second direction Y. Referring to FIG. 8, three second electrode groups 220 may be disposed between two adjacent cathodes 530 in the second direction Y.

The number of the second electrode group 220 disposed between two adjacent cathodes 530 in the second direction Y may be determined based on the specific spacing and the length of the second electrode group 220 in the second direction Y, and is not particularly limited herein.

In one embodiment, the display panel 100 may further include an insulation layer 54 on the second electrode layer 22.

Figure 11:
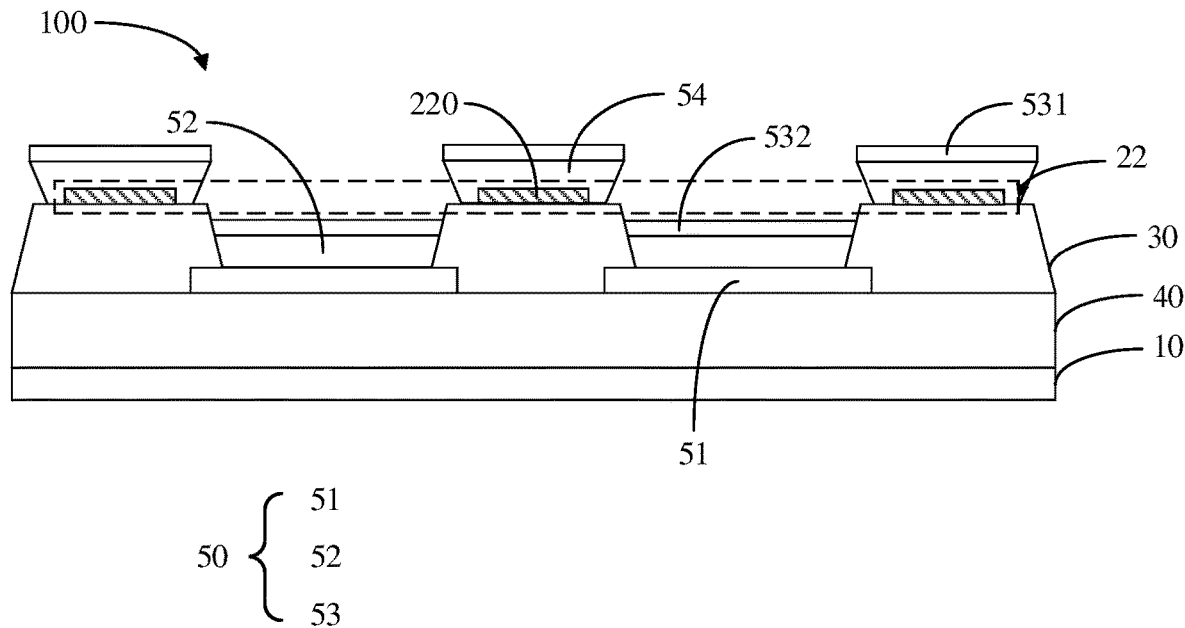
FIG. 11 is a second cross-sectional view of the display panel shown in FIG. 1 taken along the B-B plane.

Referring to FIG. 11, the cathode layer 53 may include a first cathode layer 531 and a second cathode layer 532. The first cathode layer 531 may on the insulation layer 54, and the second cathode layer 532 may on the light emitting layer 52. The first cathode layer 531 severs as a dummy electrode and does not apply voltage, so as to prevent a capacitance formed in the second electrode group 220 disposed in parallel with the first cathode layer 531 and an impact on the transmission of touch signal of the second electrode group 220. The second cathode layer 532 is a conventional cathode layer 53 and applies a constant voltage.

In one embodiment, a cross-section of the insulation layer 54 may be in a shape of an inverted trapezoid. Due to the insulation layer 54, the cathode layer 53 and the second electrode layer 22 may be formed by different masking processes. A pattern process of the second electrode layer 22 may be performed. After the insulation layer 54 is formed, the material of the cathode layer 53 is directly deposited on the whole display panel 100. Due to the insulation layer 54, the cathode layer 53 may be formed into the first cathode layer 531 and the second cathode layer 532, which are disconnected.

However, in terms of the flatness of the panel, the insulation layer 54 and the second cathode layer 532 may be removed after the second cathode layer 532 is formed to be disconnected.

In one embodiment, the display panel 100 further includes a second touch wiring layer.

Referring to FIG. 4, the second touch wiring layer includes at least one second touch wire 222, and the second touch wire 222 may be at an edge of the display panel 100. One end of the second touch wire 222 is electrically connected to the second electrode group 220, and the other end of the second touch wire 222 is electrically connected to a driver chip 70.

In one embodiment, the second touch wiring layer and the light shielding layer 41 may be disposed in a same layer. The second touch wiring layer and the light shielding layer 41 may be formed by a same masking process.

In one embodiment, the second touch wire 222 further includes a plurality of connection terminals 223 at two sides of the display panel 100. An orthographic projection of the cathode layer 53 on the substrate 10 coincides with an orthographic projection of the connection terminal 223 on the substrate 10. One end of the cathode layer 53 is electrically connected to the connection terminal 223 through a corresponding via hole.

In one embodiment, the display panel 100 further includes a thin film encapsulation layer 60 on the light emitting device layer 50, and the second electrode layer 22 may be in the thin film encapsulation layer 60.

Figure 12:
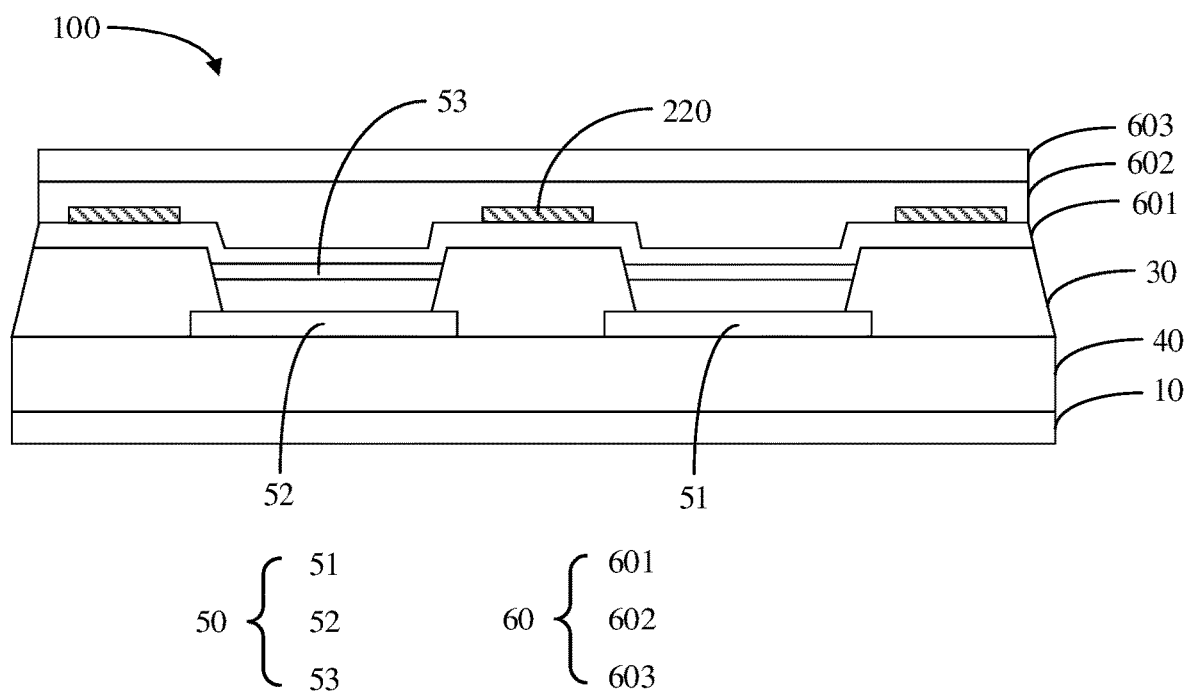
FIG. 12 is a third cross-sectional view of the display panel shown in FIG. 1 taken along the B-B plane.

Referring to FIG. 12, the thin film encapsulation layer 60 may include a first inorganic layer 601 on the cathode layer 53, a first organic layer 602 on the first inorganic layer 601, and a second inorganic layer 603 on the first organic layer 602.

The second electrode layer 22 may be disposed between the first inorganic layer 601 and the first organic layer 602, or between the first organic layer 602 and the second inorganic layer 603. The specific position is not particularly limited herein.

Based on FIG. 12, the second touch wiring layer and the second electrode layer 22 may be disposed in a same layer.

In one embodiment, the first electrode layer 21 may be disposed in the thin film encapsulation layer 60, and the specific structure is not particularly limited herein.

The present invention further provides a display device. The display device includes the above display panel. The working principle of the display device is the same as or similar to that of the above display panel, and thus the details are not described herein again.

The present invention provides a display panel and a display device, including a substrate, a touch layer on the substrate, a first electrode layer, a pixel definition layer on the first electrode layer, and a second electrode layer on the pixel definition layer. The touch layer includes the first electrode layer. The first electrode layer includes at least one first electrode group disposed along a first direction, the second electrode layer includes at least one second electrode group disposed along a second direction, the pixel definition layer covers the first electrode group, and the first electrode group is disposed perpendicular to the second electrode group. In the touch layer of the present invention, the sensing electrode layer and the anode layer are disposed in the same layer, and the drive electrode layer and the cathode layer are disposed in the same layer, such that the touch layer is incorporated with the light emitting device layer. Therefore, the thickness of the display panel is decreased, and the manufacturing process of touch layer is simplified.

In the above, the present invention has been described in the above preferred embodiments, but the preferred embodiments are not intended to limit the scope of the present invention, and a person skilled in the art may make various changes and modifications without departing from the spirit and scope of the present invention. The scope of the present invention is determined by claims.

What is claimed is:

1. A display panel, comprising a substrate, a touch layer on the substrate, and a light shielding layer;
    wherein the touch layer comprises a first electrode layer, a pixel definition layer on the first electrode layer, and a second electrode layer on the pixel definition layer;
    wherein the light shielding layer is disposed between the substrate and a thin film transistor layer;
    wherein the first electrode layer and the light shielding layer are disposed in a same layer; and
    wherein the first electrode layer comprises at least one first electrode group disposed along a first direction, the second electrode layer comprises at least one second electrode group disposed along a second direction, the pixel definition layer covers the at least one first electrode group, and the at least one first electrode group is disposed perpendicular to the at least one second electrode group.

2. The display panel according to claim 1, further comprising a thin film transistor layer on the substrate, and a light emitting device layer on the thin film transistor layer;
wherein the light emitting device layer and the touch layer are disposed in a same layer, and the light emitting device layer comprises an anode layer, a light emitting layer on the anode layer, and a cathode layer on the light emitting layer; and
wherein the anode layer comprises at least one anode disposed along the first direction, the cathode layer comprises at least one cathode disposed along the second direction, the at least one anode is spaced apart from and insulated from the at least one first electrode group, and the at least one cathode is spaced apart from and insulated from the at least one second electrode group.

3. The display panel according to claim 2, wherein the at least one first electrode group is disposed between two adjacent anodes in the first direction, and the at least one second electrode group is disposed between two adjacent cathodes in the second direction.

4. The display panel according to claim 2, wherein the first electrode layer and the anode layer are disposed in a same layer.

5. The display panel according to claim 2, wherein the first electrode layer and the anode layer are disposed in different layers, the anode layer is on the thin film transistor layer and contacts the thin film transistor layer, and the first electrode layer is in the pixel definition layer.

6. The display panel according to claim 2, wherein the second electrode layer and the cathode layer are formed by a same masking process.

7. The display panel according to claim 2, further comprising an insulation layer on the second electrode layer;
wherein the cathode layer comprises a first cathode layer and a second cathode layer, the first cathode layer is on the insulation layer, the second cathode layer is on the light emitting layer, and a cross-section of the insulation layer is in a shape of an inverted trapezoid.

8. The display panel according to claim 2, further comprising a thin film encapsulation layer on the light emitting device layer;
wherein the second electrode layer is in the thin film encapsulation layer.

9. The display panel according to claim 1, further comprising a second touch wiring layer;
wherein the second touch wiring layer comprises at least one second touch wire, the at least one second touch wire is at an edge of the display panel, the at least one second touch wire is electrically connected to the at least one second electrode group, and the second touch wiring layer and a light shielding layer are disposed in a same layer.

10. A display device, comprising a display panel;
wherein the display panel comprises a substrate, a touch layer on the substrate, and a light shielding layer;
wherein the touch layer comprises a first electrode layer, a pixel definition layer on the first electrode layer, and a second electrode layer on the pixel definition layer; and
wherein the light shielding layer is disposed between the substrate and a thin film transistor layer;
wherein the first electrode layer and the light shielding layer are disposed in a same layer; and
wherein the first electrode layer comprises at least one first electrode group disposed along a first direction, the second electrode layer comprises at least one second electrode group disposed along a second direction, the pixel definition layer covers the at least one first electrode group, and the at least one first electrode group is disposed perpendicular to the at least one second electrode group.

11. The display device according to claim 10, wherein the display panel further comprises a thin film transistor layer on the substrate, and a light emitting device layer on the thin film transistor layer;
wherein the light emitting device layer and the touch layer are disposed in a same layer, and the light emitting device layer comprises an anode layer, a light emitting layer on the anode layer, and a cathode layer on the light emitting layer; and
wherein the anode layer comprises at least one anode disposed along the first direction, the cathode layer comprises at least one cathode disposed along the second direction, the at least one anode is spaced apart from and insulated from the at least one first electrode group, and the at least one cathode is spaced apart from and insulated from the at least one second electrode group.

12. The display device according to claim 11, wherein the at least one first electrode group is disposed between two adjacent anodes in the first direction, and the at least one second electrode group is disposed between two adjacent cathodes in the second direction.

13. The display device according to claim 11, wherein the first electrode layer and the anode layer are disposed in a same layer.

14. The display device according to claim 11, wherein the first electrode layer and the anode layer are disposed in different layers, the anode layer is on the thin film transistor layer and contacts the thin film transistor layer, and the first electrode layer is in the pixel definition layer.

15. The display device according to claim 11, wherein the second electrode layer and the cathode layer are formed by a same masking process.

16. The display device according to claim 11, wherein the display panel further comprises an insulation layer on the second electrode layer; and
wherein the cathode layer comprises a first cathode layer and a second cathode layer, the first cathode layer is on the insulation layer, the second cathode layer is on the light emitting layer, and a cross-section of the insulation layer is in a shape of an inverted trapezoid.

17. The display device according to claim 11, wherein the display panel further comprises a thin film encapsulation layer on the light emitting device layer, and the second electrode layer is in the thin film encapsulation layer.

18. The display device according to claim 10, wherein the display panel further comprises a second touch wiring layer, the second touch wiring layer comprises at least one second touch wire, the at least one second touch wire is at an edge of the display panel, the at least one second touch wire is electrically connected to the at least one second electrode group, and the second touch wiring layer and a light shielding layer are disposed in a same layer.

* * * * *